US006734072B1

United States Patent
Chong et al.

(10) Patent No.: US 6,734,072 B1
(45) Date of Patent: May 11, 2004

(54) METHOD OF FABRICATING A MOSFET DEVICE USING A SPIKE RAPID THERMAL OXIDATION PROCEDURE

(75) Inventors: Yung Fu Chong, Singapore (SG); Alex See, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/379,814

(22) Filed: Mar. 5, 2003

(51) Int. Cl.[7] .............................................. H01L 21/336
(52) U.S. Cl. ...................... 438/306; 438/585; 438/771
(58) Field of Search ................................. 438/197, 585, 438/771, FOR 399

(56) References Cited

U.S. PATENT DOCUMENTS

| | | | | |
|---|---|---|---|---|
| 6,033,963 | A | 3/2000 | Huang et al. | 438/303 |
| 6,107,140 | A | 8/2000 | Lee et al. | 438/259 |
| 6,140,688 | A | 10/2000 | Gardner et al. | 257/412 |
| 6,242,354 | B1 * | 6/2001 | Thomas | 438/696 |
| 6,300,203 | B1 | 10/2001 | Buynoski et al. | 438/287 |
| 6,303,418 | B1 * | 10/2001 | Cha et al. | 438/199 |
| 6,365,450 | B1 | 4/2002 | Kim | 438/216 |
| 6,391,697 | B2 | 5/2002 | Lee | 438/197 |
| 6,512,266 | B1 * | 1/2003 | Deshpande et al. | 257/333 |
| 2002/0001914 | A1 * | 1/2002 | Lee | 438/401 |
| 2002/0020867 | A1 * | 2/2002 | Shiozawa et al. | 257/301 |
| 2002/0058410 | A1 * | 5/2002 | Sung et al. | 438/649 |
| 2002/0142529 | A1 * | 10/2002 | Matsuda et al. | 438/175 |
| 2003/0062586 | A1 * | 4/2003 | Wallace et al. | 257/506 |

* cited by examiner

Primary Examiner—George Fourson
Assistant Examiner—Michelle Estrada
(74) Attorney, Agent, or Firm—George O. Saile; Rosemary L. S. Pike

(57) ABSTRACT

A method of forming a conductive gate structure on an underlying gate insulator layer, without the use of a plasma dry etch conductive gate definition procedure, has been developed. After formation of source/drain extension (SDE) and heavily doped source/drain regions, an opening is formed in a planarized dielectric layer exposing the top surface of a semiconductor alloy layer, or exposing the top surface of a semiconductor substrate, while the planarized dielectric layer and adjacent insulator spacers overlay the source/drain regions. A multiple spike, rapid thermal oxidation (RTO) procedure is employed to grow a gate insulator layer on the region of semiconductor alloy, or semiconductor, exposed in the opening, with the low temperature RTO procedure, and the planarized dielectric layer overlying the source/drain regions, suppressing out diffusion of SDE dopants. A conductive layer is next deposited and then planarized via a chemical mechanical polishing procedure, resulting in the definition of a conductive gate structure on the gate insulator layer, with the conductive gate structure formed without employment of plasma dry etching eliminating the risk of plasma induced damage of the gate insulator layer.

24 Claims, 6 Drawing Sheets

METHOD OF FABRICATING A MOSFET DEVICE USING A SPIKE RAPID THERMAL OXIDATION PROCEDURE

BACKGROUND OF THE INVENTION (1) Field of the Invention

The present invention relates to methods used to fabricate semiconductor devices, and more specifically to a method of fabricating a metal oxide semiconductor field effect transistor (MOSFET) device, using a replacement gate dielectric layer and featuring spike rapid thermal oxidation procedures to preserve ultra-shallow junctions.

(2) Description of Prior Art

Miro-miniaturization, or the ability to fabricate semiconductor devices with sub-micron features needed to increase device performance and to reduce processing costs, has been in part accomplished via advancements in specific fabrication disciplines such as photolithography and dry etching. The use of more sophisticated exposure tools as well as the use of more sensitive photoresist materials have allowed sub-0.13 um features to be routinely defined in photoresist layers. In addition the development of more advanced dry etching tools and processes have allowed the sub-0.13 um features in masking photoresist shapes to be successfully transferred to underlying materials, such as the insulator, metal, and semiconductor layers, used for formation of semiconductor devices. However in addition to the shrinking features used for sub-0.13 um devices, the thickness of specific materials or elements of the sub-0.13 um device also have to be reduced. One such MOSFET element needed to be reduced in thickness to provide performance benefits is the gate dielectric layer, however the use of the thinner gate dielectric layers highlight specific areas of concern not as critical with the use of thicker gate dielectric layers. First, plasma induced damage of the gate dielectric layer, incurred during a plasma dry etching procedure used to define an overlying conductive gate structure, can result in deleterious charge generation in the underlying gate dielectric layer, in addition to degrading the gate dielectric breakdown strength. Secondly, when a gate dielectric layer such as silicon dioxide is formed on an underlying semiconductor alloy layer such as silicon-germanium, subsequent high temperature processing procedures can result in unwanted segregation of germanium at the silicon dioxide/silicon-germanium interface.

The present invention will describe a method of fabricating a MOSFET device wherein the conductive gate structure, formed on an underlying gate dielectric layer, is not defined via plasma dry etching procedures thus eliminating the possibility of plasma induced damage of the gate dielectric layer. In addition this invention will describe procedures used for the formation of the gate dielectric layer which also provide for activation of dopants in already formed ultra-shallow source/drain regions, thus eliminating the use of higher temperature dopant activation procedures, and thus allowing the use of silicon-germanium underlying the gate dielectric layer with decreased risk of germanium segregation phenomena. Prior art such as Buynoski et at, in U.S. Pat. No. 6,300,203 B1, Gardner et al, in U.S. Pat. No. 6,140,688, Lee et al, in U.S. Pat. No. 6,107,140, Kim, in U.S. Pat. No. 6,365,450 B1, Lee, in U.S. Pat. No. 6,391,697 B2, and Huang et al, in U.S. Pat. No. 6,033,963, describe methods of forming gate dielectric layers without subsequent exposure to plasma dry etching procedures. None of the above prior art however describe the novel combination of process steps used in the present invention featuring formation of a gate dielectric layer on a semiconductor alloy layer, without gate dielectric layer exposure to plasma dry etching procedures, and with a gate dielectric formation procedure allowing dopant activation to occur without segregation of a semiconductor alloy component at the gate dielectric-semiconductor alloy interface.

SUMMARY OF THE INVENTION

It is an object of this invention to fabricate a metal oxide semiconductor field effect transistor (MOSFET) device, wherein a gate insulator layer is formed on a semiconductor alloy layer.

It is another object of this invention to form a gate insulator layer via a multiple spike rapid thermal oxidation procedure, at temperatures which does not result in movement of dopants in already formed source/drain extension (SDE), regions.

It is still another object of this invention to define a conductive gate structure on an underlying gate insulator layer without the use of reactive ion etching (RIE) procedures, thus avoiding plasma induced damage (PID) of the gate insulator layer.

In accordance with the present invention a method of forming a MOSFET device featuring a gate insulator layer obtained via a multiple spike rapid thermal oxidation (RTO) procedure, and obtained via formation of an overlying conductive gate structure formed without the use of RIE procedures, preventing plasma induced damage of the gate insulator layer, is described. A composite insulator layer comprised of an underlying pad silicon oxide layer and an overlying silicon nitride layer, is formed on the surface of a semiconductor substrate, or on a semiconductor alloy layer located on the semiconductor substrate. A composite insulator shape is defined on the surface of the semiconductor alloy layer followed by formation of a SDE region in an area of the semiconductor alloy layer not covered by the composite insulator shape. Insulator spacers are formed on the sides of the composite insulator shape followed by formation of a heavily doped source/drain region in an area of the semiconductor alloy layer not covered by the composite insulator shape or by the insulator spacers. Deposition of an undoped silica glass (USG) layer, and planarization procedures, are followed by selective removal of the composite insulator shape, resulting in an opening in the USG layer, and in the adjacent insulator spacers, exposing a portion of the top surface of the semiconductor alloy layer located between portions of the SDE region. A gate insulator layer is formed on the exposed portion of the semiconductor alloy layer via a first portion of the spike RTO procedure, performed at a temperature which does not result in diffusion of SDE dopants but results in the growth of the gate insulator layer, while a second portion of the multiple spike RTO procedure, performed at a higher temperature results in activation of the dopants in both SDE and heavily doped source/drain regions. If desired an additional high dielectric constant insulator layer can be formed on the underlying gate insulator layer. Deposition of a conductive layer followed by a plananzation procedure results in a conductive gate structure on the underlying gate insulator layer, and located in the opening previously defined in the USG-insulator spacers.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
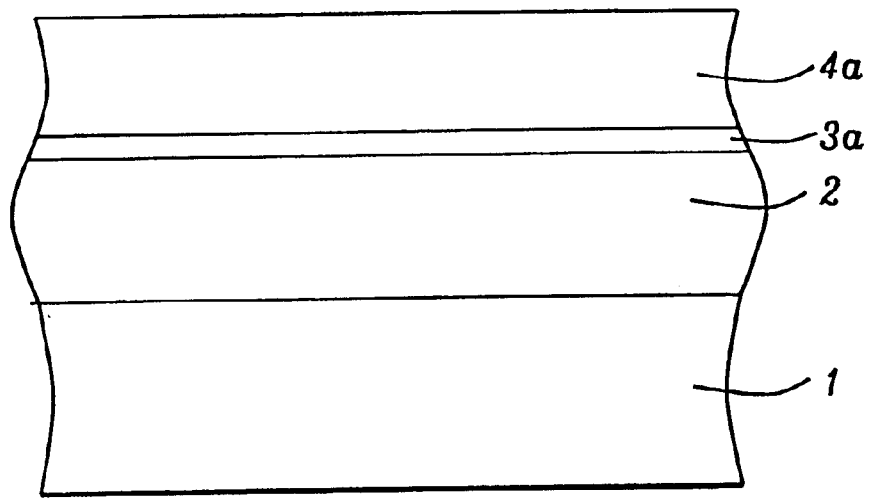
FIGS. 1–8, 10–11, which schematically in cross-sectional style show key stages used to fabricate a MOSFET device in which a gate insulator is formed via a multiple spike RTO procedure, and wherein a conductive gate structure is formed on the underlying gate insulator layer without the use of RIE procedures.

The method of fabricating a MOSFET device featuring a gate insulator layer formed via a multiple spike RTO procedure, and featuring definition of an overlying conductive gate structure formed without the use of RIE procedures to prevent plasma induced damage of the gate insulator layer, will now be described in detail. Semiconductor substrate 1, comprised of P type single crystalline silicon, featuring a <100> crystallographic orientation, is used and schematically shown in FIG. 1. A subsequent gate insulator can either be formed on the top surface of semiconductor substrate 1, or if desired to enhance MOSFET performance via increased carrier mobility in the channel region, the subsequent gate insulator layer can be formed on a silicon layer overlying a semiconductor alloy such as a silicon-germanium layer, or can be formed on a semiconductor alloy layer such as a silicon-germanium layer. For this description the semiconductor alloy layer option will be used. Silicon-germanium layer 2, is therefore epitaxially grown to a thickness between about 0.10 to 4 micrometers via conventional procedures such as chemical vapor deposition (CVD), using silane or disilane as a source of silicon, while germane is used as a source of germanium. The weight percent of germanium in silicon-germanium layer 2, which will influence the carrier mobility in the MOSFET device channel region, is between about 5 to 35. Silicon oxide layer 3a, to be used as a pad oxide layer, is next formed on silicon-germanium layer 2, at a thickness between about 30 to 200 Angstroms, via low pressure chemical vapor deposition (LPCVD), or via plasma enhanced chemical vapor deposition (PECVD) procedures. If desired, silicon oxide layer 3a can also be obtained via thermal oxidation procedures. Silicon nitride layer 4a is next formed on underlying silicon oxide layer 3a, at a thickness between about 500 to 2500 Angstroms, via LPCVD or PECVD procedures. The result of the above process steps is schematically shown in FIG. 1.

Figure 2:
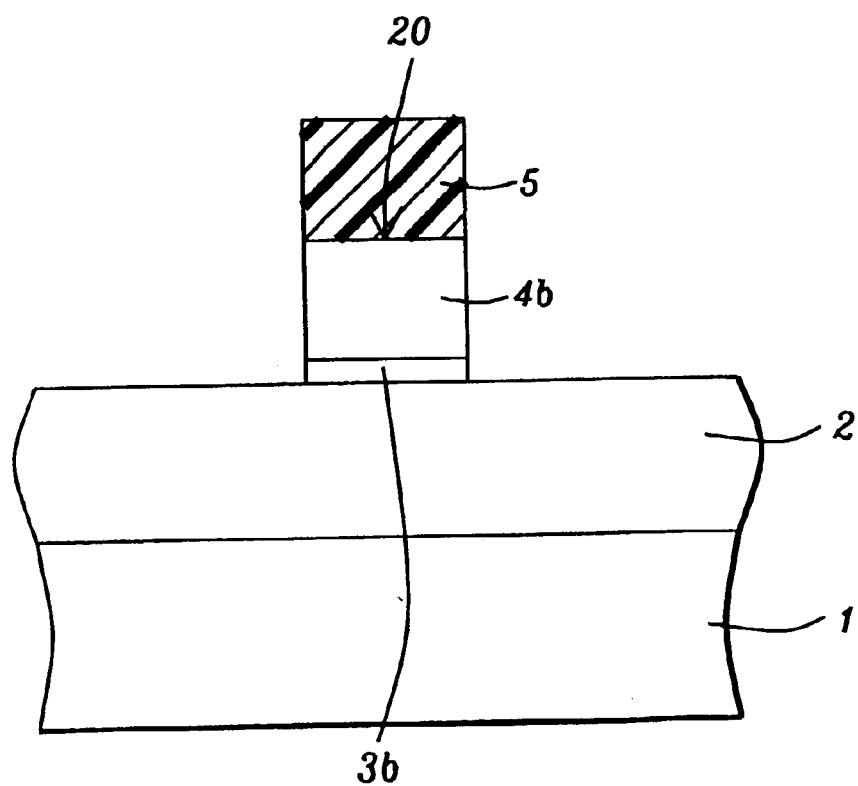

Photoresist shape 5, is next defined on silicon nitride layer 4a, and used as an etch mask to define composite insulator shape 20, on underlying silicon-germanium layer 2, with composite insulator shape 20, comprised of silicon nitride shape 4b, and underlying silicon oxide shape 3b. Definition of composite insulator shape 20, shown schematically in FIG. 2, is accomplished via an anisotropic RIE procedure performed using $C_2F_6$ as an etchant for silicon nitride layer 4a, while $CHF_3/O_2$ is used as an etchant for silicon oxide layer 3a, selectively terminating at the appearance of the top surface of silicon-germanium layer 2. The width of photoresist shape 5, and of defined composite insulator shape 20, which will determine the width of a subsequent conductive gate structure, is between about 20 to 130 nanometres.

Figure 3:
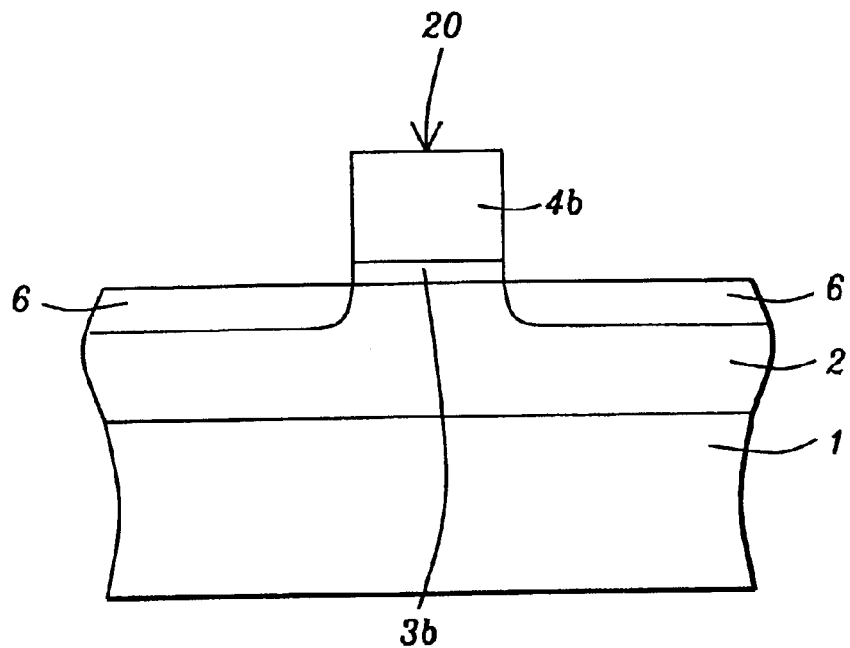

Photoresist shape 5, is now removed via plasma oxygen ashing procedures, followed by formation of SDE region 6, shown schematically in FIG. 3. This invention can be applied to N channel, as well as to P channel MOSFET devices, however in this description the invention will be applied to an N channel MOSFET device. SDE region 6, is formed in an area of silicon-germanium layer 2, not covered by composite insulator shape 20, via implantation of arsenic or phosphorous ions at an energy between about 3 to 10 KeV, and at a dose between about 5E14 to 3E15 atoms/$cm^2$. The space between the portions of SDE region 6, will determine the channel length of the MOSFET device.

Figure 4:
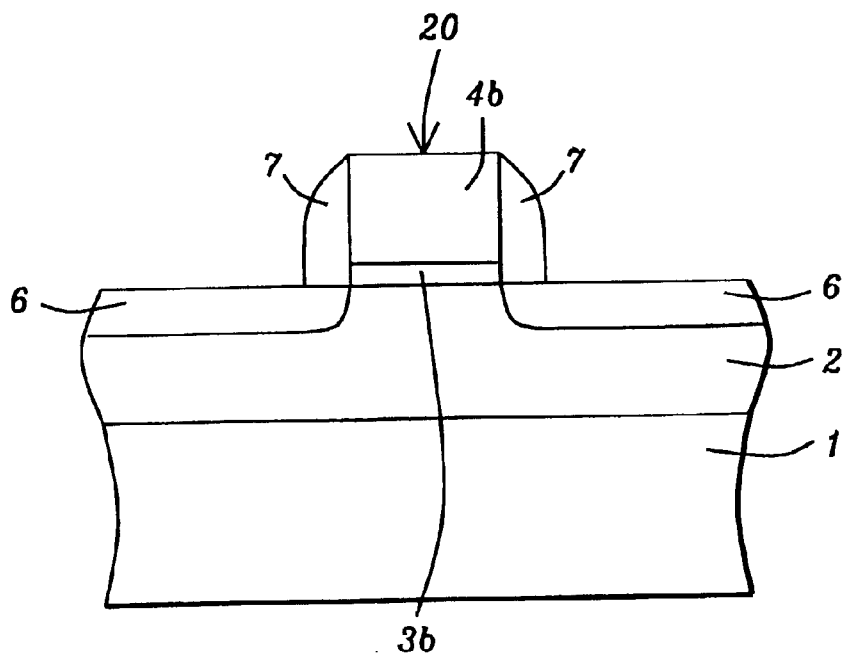
Figure 5:
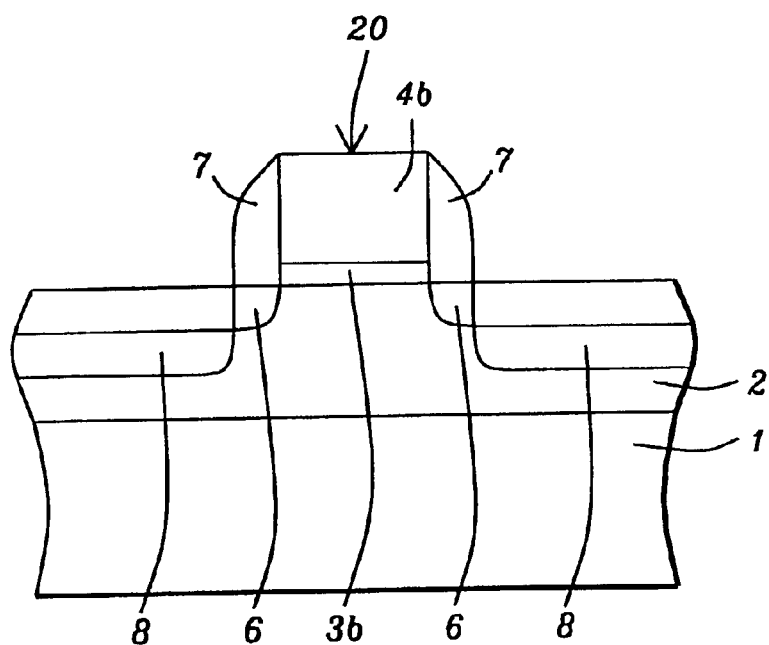

A silicon oxide layer is next deposited to a thickness between about 200 to 1500 Angstroms, via LPCVD or PECVD procedures. An anisotropic RIE procedure, performed using $CHF_3/O_2$ as a selective etchant for silicon oxide, is used to form silicon oxide spacers 7, on the sides of composite insulator shape 20. This is schematically shown in FIG. 4. Implantation of arsenic or phosphorous ions, at an energy between about 10 to 70 KeV, at a dose between about 3E15 to 7E15 atoms/$cm^2$, is next performed in an area of silicon-germanium layer 2, not covered by composite insulator shape 20, and by insulator spacers 7, resulting in the formation of heavily doped source/drain region 8. This is schematically shown in FIG. 5

Figure 6:
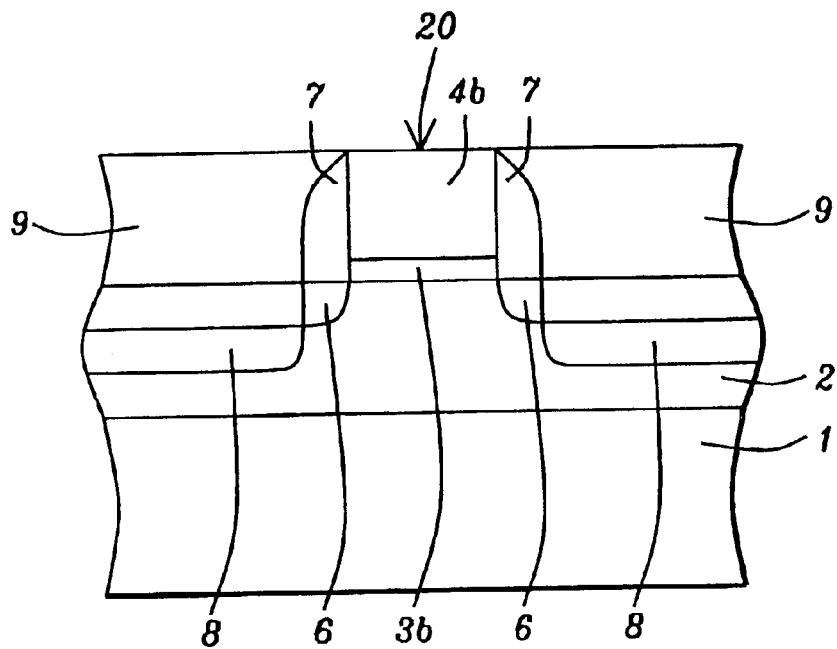

Dielectric layer 9, comprised of a layer such as an undoped silica glass (USG), boro-phosphosilicate (BPSG), or phosphosilicate glass (PSG), is next deposited via LPCVD or PECVD procedures, to a thickness between about 600 to 4000 Angstroms. For this description the USG option will be used. Planarization of dielectric layer 9, is next accomplished via chemical mechanical polishing (CMP) procedures, resulting in a smooth top surface for dielectric layer 9, and exposing the top surface of composite insulator shape 20. The result of these procedures is schematically illustrated using FIG. 6.

Figure 7:
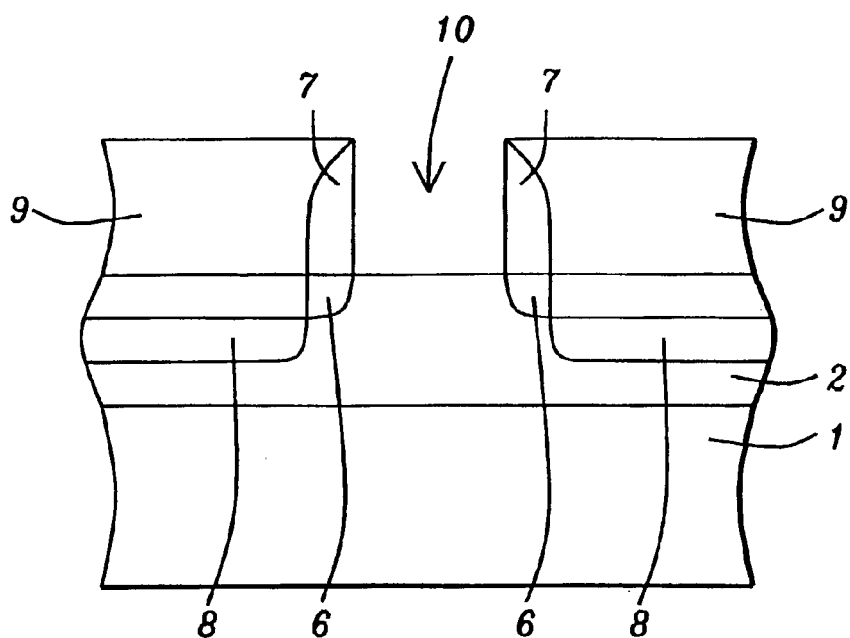

Selective removal of composite insulator shape 20, is next addressed with the result of the procedure illustrated in FIG. 7. Silicon nitride shape 4b, is selectively removed via wet etch procedures using a hot phosphoric acid solution as an etchant, or silicon nitride shape can be removed via a RIE procedure using $C_2F_6$ as a selective etchant. Silicon oxide shape pad 3b, is selectively removed via an anisotropic RIE procedure using $CHF_3/O_2$ as a selective etchant for silicon oxide. The selective and anisotropic etching procedures do not etch silicon oxide spacers 7, thus resulting in the definition of opening 10, at a width equal to the width of the removed composite insulator shape 20. A portion of the top surface of silicon-germanium layer 2, is now exposed at the bottom of opening 10.

Figure 8:
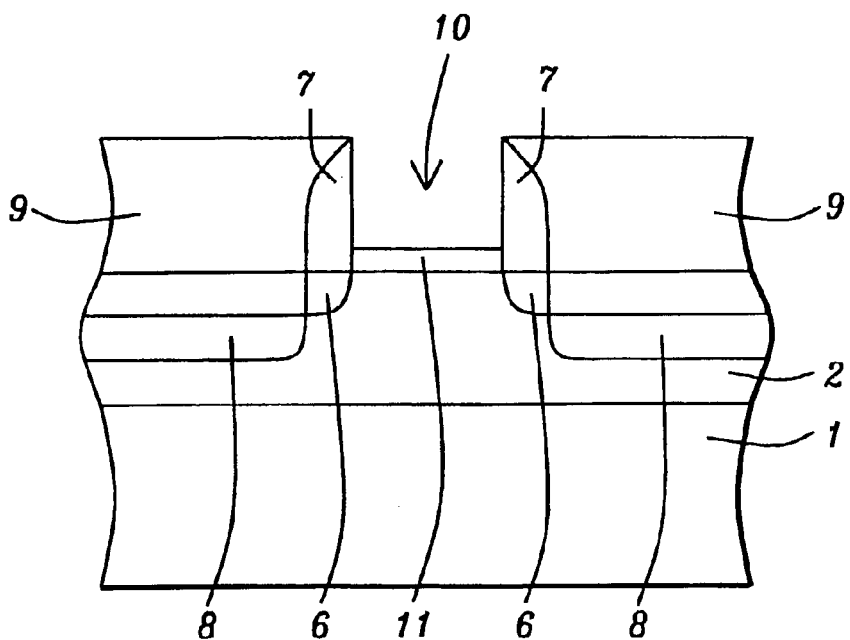
Figure 9:
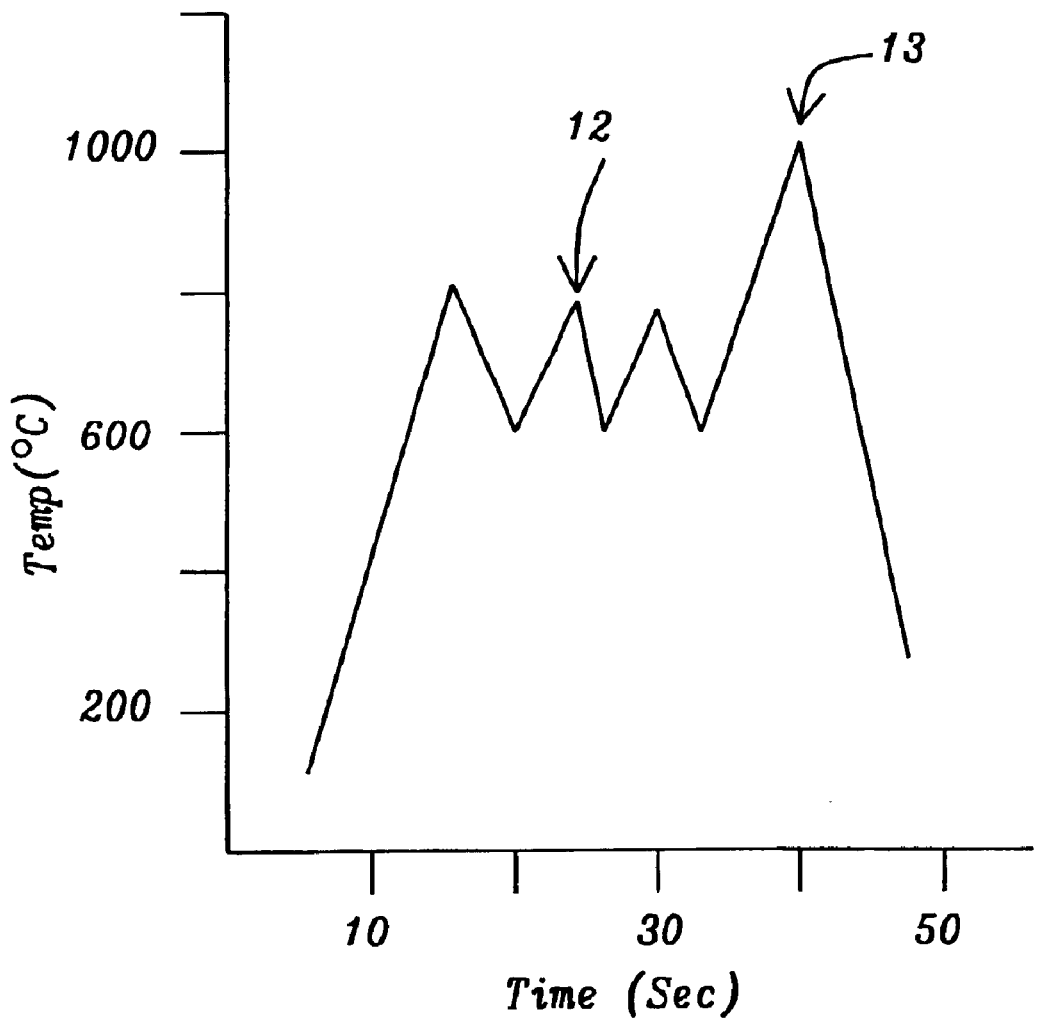
FIG. 9, which graphically illustrates the thermal profile for the multiple spike RTO procedure used to form the gate insulator layer used in this present invention.

The critical procedure of forming gate insulator layer 11, on the portion of silicon-germanium layer 2, exposed at the bottom of opening 10, is next described. To avoid movement of dopants located in SDE region 6, which will change the desired, designed channel length, a multiple spike RTO procedure employed to minimize thermal budget is used. The procedure is performed in a tool used for rapid thermal processing procedures featuring a first step comprised of multiple cycles, with each cycle ramped from 600 to 850° C., with each cycle performed for a time between about 1–50 sec, and at a pressure between about 0.01 to 200 torr, with the conditions of the first step designed to result in an initial thickness of gate insulator 11, between about 3 to 10 Angstroms. The number of cycles used, and the conditions, time, temperature and pressure, are chosen to result in an initial thickness less than the desired final thickness. Gate insulator layer 11, can be comprised of silicon oxide, silicon oxynitride or silicon nitride, with the reactants injected during the cycles comprised of either oxygen, NO or $N_2O$, or a mixture of the reactants. A second step of the multiple spike RTO procedure, used to activate the dopants in SDE region 6, as well as in heavily doped source/drain region 8, and to improve the quality of gate insulator layer 11, is performed via a cycle ramped from a temperature between about 600 to 850° C., to a temperature between about 950 to 1150° C. This cycle is performed for a time between about 50 to 1000 milliseconds, at a pressure between about 0.01 to 200 torr, in a desired ambient, resulting in gate insulator layer 11, at a final thickness between about 8 to 15 Angstroms. The formation of gate insulator layer 11, is schematically shown in FIG. 8, while FIG. 9, graphically illustrates the thermal profile for the multiple spike RTO procedure. Although the ambient used for formation of gate insulator layer 11, was comprised of either $O_2$, $N_2O$, or NO, the low temperatures and short times employed during the multiple spike RTO procedure, in addition to the capping of SDE and heavily doped source/drain regions by dielectric layer 9, prevented oxygen enhanced diffusion of dopants in the capped regions from occurring.

Figure 10:
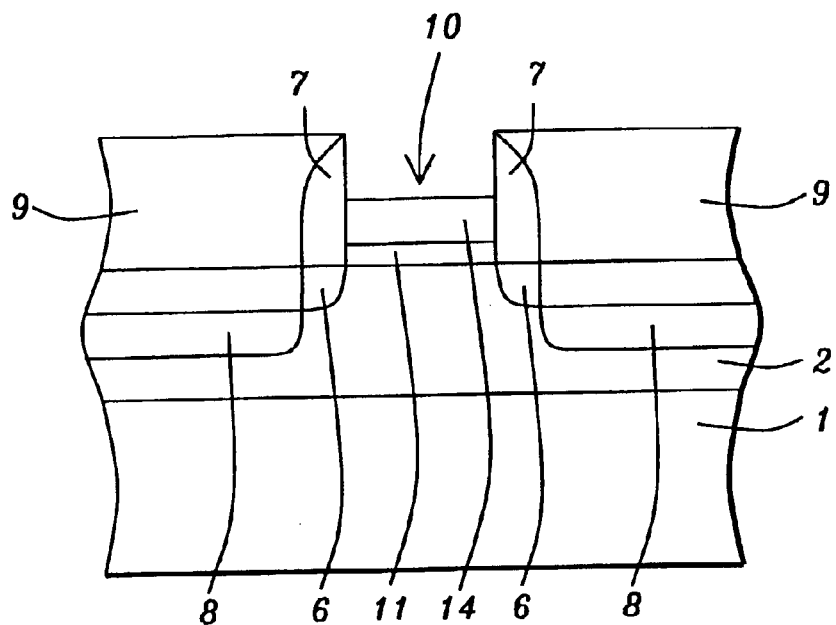

If desired, gate insulator layer 11 can be used as a buffer, or underlying layer for an overlying high dielectric constant layer, such as $HfO_2$ or $ZrO_2$. This would be accomplished via deposition of high dielectric constant layer 14, via CVD procedures, to a thickness between about 5 to 30 Angstroms. This is schematically shown in FIG. 10.

Figure 11:
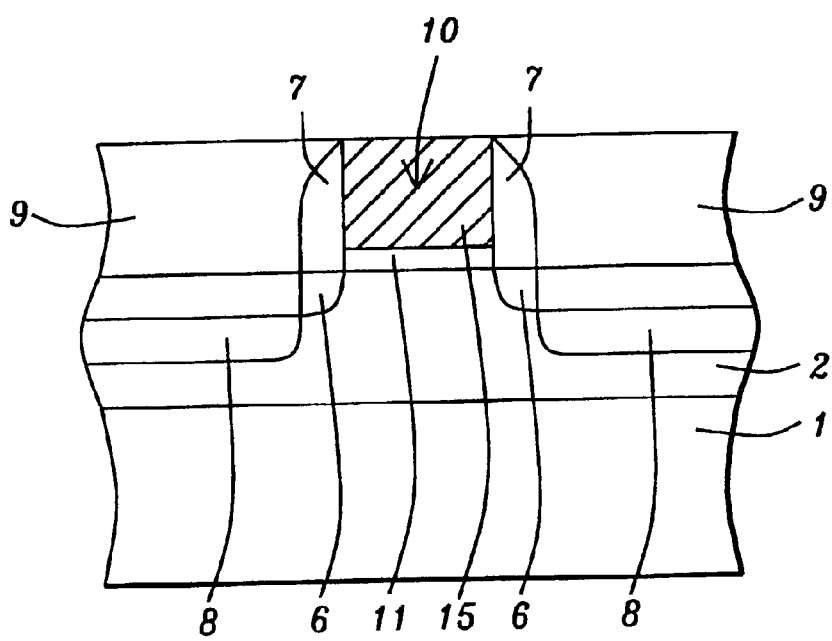

Formation of conductive gate structure 15, in opening 10, is next addressed and schematically described using FIG. 11. A conductive layer such as doped polysilicon, polysilicon-germanium, or metal, is deposited to a thickness between about 500 to 2500 Angstroms, completely filling opening 10. The doped polysilicon layer is deposited via chemical vapor deposition (CVD) procedures, doped in-situ during deposition via the addition of arsine, phosphine, or diborane to a silane or disilane ambient, while the polysilicon-germanium layer option is also obtained via CVD procedures using silane or disilane as a polysilicon source, while germane is used as the germanium source. The content of germanium in the polysilicon-germanium layer, between about 5 to 35 weight percent, will determine the MOSFET work function and thus directly influence threshold voltage. The polysilicon-germanium layer is also doped in-situ during deposition. Doping of the polysilicon layer cam also be accomplished via well established photolithography and ion implantation techniques. The metal layer option can be accomplished using a conductive material such as copper, aluminum, or tungsten, obtained via physical vapor deposition procedures. A chemical mechanical polishing (CMP) procedure is next employed to remove portions of the conductive layer from the top surface of dielectric layer 9, resulting in the definition of conductive gate structure 15, in opening 10. Of greatest importance is the definition of conductive gate structure 15, without the use of plasma dry etching procedures. If plasma dry etching procedures were used for the definition of conductive gate structure 15, exposure of gate insulator layer 11 to these procedures may have resulted in plasma induced damage of the gate insulator layer, thus creating a leaky, non-reliable gate insulator layer.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a metal oxide semiconductor field effect transistor (MOSFET) device, on a semiconductor substrate, comprising the steps of:

forming a composite insulator shape on a portion of a top surface of said semiconductor substrate;

forming a source/drain extension (SDE) region in an area of said semiconductor substrate not covered by said composite insulator shape;

forming insulator spacers on sides of said composite insulator shape;

forming a heavily doped source/drain region in an area of said semiconductor substrate not covered by said composite insulator shape or by said insulator spacers;

forming a planarized dielectric layer on portions of said semiconductor substrate not covered by said composite insulator shape or by said insulator spacers;

removing said composite insulator shape resulting in an opening exposing a portion of a top surface of said semiconductor substrate;

forming a gate insulator layer on said portion of said semiconductor substrate exposed in said opening, wherein said gate insulator layer is obtained via a multiple spike rapid thermal oxidation (RTO) procedure featuring a first step comprised of multiple cycles, each performed in an ambient comprised with either $O_2$, NO, and $N_2O$, or in a mixture of $O_2$, NO, or $N_2O$, with each cycle performed at a temperature between about 600 to 850° C., for a time between about 1 to 50 sec, and with each cycle performed at a pressure between about 0.01 to 200 torr, and featuring a second step performed in a desired ambient, at a temperature between about 950 to 1500° C., for a time between about 50 to 1000 millisecond, at a pressure between about 0.01 to 200 torr; and forming a conductive gate structure in said opening, overlying said gate insulator layer.

2. The method of claim 1, wherein said semiconductor substrate is overlaid with a semiconductor alloy layer.

3. The method of claim 1, wherein said semiconductor substrate is overlaid with a semiconductor alloy layer comprised of silicon-germanium, with the silicon-germanium layer at a thickness between about 0.01 to 4 micrometers, and with a weight percent of germanium between about 5 to 35.

4. The method of claim 1, wherein said composite insulator shape is comprised of an underlying silicon oxide shape at a thickness between about 30 to 200 Angstroms, and of an overlying silicon nitride shape at a thickness between about 500 to 2500 Angstroms.

5. The method of claim 1, wherein the width of said composite insulator shape is between about 20 to 130 nanometres.

6. The method of claim 1, wherein said source/drain extension (SDE) region is formed via implantation of arsenic or phosphorous ions, at an energy between about 3 to 10 KeV, at a dose between about 5E14 to 3E15 atoms/$cm^2$.

7. The method of claim 1, wherein said insulator spacers are comprised of silicon oxide at a thickness between about 200 to 1500 Angstroms.

8. The method of claim 1, wherein said heavily doped source/drain region is formed via implantation of arsenic or phosphorous ions, at an energy between about 10 to 70 KeV, at a dose between about 3E15 to 7E15 atoms/$cm^2$.

9. The method of claim 1, wherein said planarized dielectric layer is an undoped silica glass (USG) layer, obtained via LPCVD or PECVD procedures to a thickness between about 600 to 4000 Angstroms, then planarized via chemical mechanical polishing procedures.

10. The method of claim 1, wherein said composite insulator shape is removed via a selective wet etch of an overlying silicon nitride shape using a hot phosphoric acid solution, and via an anisotropic RIE procedure performed using $CHF_3/O_2$ as an etchant for an underlying silicon oxide shape.

11. The method of claim 1, wherein said gate insulator layer is comprised of either silicon oxide, silicon oxynitride, or silicon nitride, at a thickness between about 3 to 10 Angstroms.

12. The method of claim 1, wherein said conductive gate structure is comprised of a conductive material such as doped polysilicon, polysilicon-germanium, or metal, defined via deposition of the conductive layer followed by definition via a chemical mechanical polishing procedure.

13. A method of forming a conductive gate structure on an underlying gate insulator layer for a MOSFET device, comprising the steps of:

providing a semiconductor substrate;

forming a semiconductor alloy layer on said semiconductor substrate;

forming a silicon oxide pad layer on said semiconductor alloy layer;

forming a silicon nitride layer on said silicon oxide pad layer;

forming a composite insulator shape on a portion of a top surface of said semiconductor alloy layer, with said composite insulator shape comprised of a silicon nitride shape and an underlying silicon oxide shape;

forming a source/drain extension (SDE) region in an area of said semiconductor alloy layer not covered by said composite insulator shape;

forming silicon oxide spacers on sides of said composite insulator shape;

forming a heavily doped source/drain region in an area of said semiconductor alloy layer not covered by said composite insulator shape or by said silicon oxide spacers;

forming a planarized dielectric layer on portions of said semiconductor alloy layer not covered by said composite insulator shape or by said silicon oxide spacers;

removing said composite insulator shape resulting in an opening in said planarized dielectric layer and in said silicon oxide spacers, exposing a portion of a top surface of said semiconductor alloy layer;

performing a multiple spike rapid thermal oxidation (RTO) procedure to form a gate insulator layer on the portion of said semiconductor alloy layer exposed in said opening;

forming a conductive layer completely filling said opening; and performing a chemical mechanical polishing (CMP) procedure removing portion of said conductive layer from the top surface of said planarized dielectric layer, resulting in definition of said conductive gate structure on said gate insulator layer, in said opening.

14. The method of claim 13, wherein said semiconductor alloy layer is a silicon-germanium layer, obtained at a thickness between about 0.10 to 4 micrometers via chemical vapor deposition procedures, comprised with a germanium weight percent between about 5 to 35.

15. The method of claim 13, wherein said silicon oxide pad layer is obtained at a thickness between about 30 to 200 Angstroms, via LPCVD or PECVD procedures.

16. The method of claim 13, wherein said silicon nitride layer is obtained at a thickness between about 500 to 2500 Angstroms, via LPCVD or PECVD procedures.

17. The method of claim 13, wherein said composite insulator shape is defined via an anisotropic RIE procedure using $C_2F_6$ as an etchant for said silicon nitride layer, and using $CHF_3/O_2$ as an etchant for said silicon oxide pad layer.

18. The method of claim 13, wherein the width of said composite insulator shape is between about 20 to 130 nanometres.

19. The method of claim 13, wherein said silicon oxide spacers are formed at a thickness between about 200 to 1500 Angstroms.

20. The method of claim 13, wherein said planarized dielectric layer is an undoped silica glass (USG) layer, obtained via LPCVD or PECVD procedures to a thickness between about 600 to 4000 Angstroms, then planarized via a chemical mechanical polishing procedure.

21. The method of claim 13, wherein said composite insulator shape is removed via a selective wet etch of an overlying silicon nitride shape using a hot phosphoric acid solution, and via an anisotropic RIE procedure performed using $CHF_3/O_2$ as an etchant for an underlying silicon oxide shape.

22. The method of claim 13, wherein said gate insulator layer is comprised of either silicon oxide, silicon oxynitride, or silicon nitride, at a thickness between about 3 to 10 Angstroms.

23. The method of claim 13, wherein said gate insulator layer is obtained via said multiple spike rapid thermal oxidation (RTO) procedure featuring a first step comprised of multiple cycles, each performed in an ambient comprised with either $O_2$, NO, and $N_2O$, or in a mixture of $O_2$, NO, or $N_2O$, with each cycle performed at a temperature between about 600 to 850° C., for a time between about 1 to 50 sec, and with each cycle performed at a pressure between about 0.01 to 200 torr, and featuring a second step performed in a desired ambient, at a temperature between about 950 to 1150° C., for a time between about 50 to 1000 milliseconds, at a pressure between about 0.01 to 200 torr.

24. The method of claim 13, wherein said conductive layer is comprised of either doped polysilicon, polysilicon-germanium, or metal.

* * * * *